(12) United States Patent
Christenson et al.

(10) Patent No.: US 6,428,713 B1
(45) Date of Patent: Aug. 6, 2002

(54) MEMS SENSOR STRUCTURE AND MICROFABRICATION PROCESS THEREFOR

(75) Inventors: John Carl Christenson, Kokomo; Steven Edward Staller, Russiaville; John Emmett Freeman, Kempton; Troy Allan Chase, Kokomo; Robert Lawrence Healton, Kokomo; David Boyd Rich, Kokomo, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/410,713

(22) Filed: Oct. 1, 1999

(51) Int. Cl.$^7$ .............................................. H01L 21/00
(52) U.S. Cl. .................. 216/2; 216/33; 216/41; 216/59; 216/67; 216/79; 438/719; 438/735
(58) Field of Search ................. 216/2, 33, 41, 216/59, 67, 79; 438/14, 719, 723, 735, 743; 73/517 R, 517 A (56) References Cited

U.S. PATENT DOCUMENTS

| | | | |
|---|---|---|---|
| 5,251,484 A | | 10/1993 | Mastache .................. 73/517 A |
| 5,447,601 A | * | 9/1995 | Norris ........................... 216/2 |
| 5,840,199 A | * | 11/1998 | Warren ......................... 216/2 |
| 6,174,820 B1 | * | 1/2001 | Habermehl et al. ......... 216/2 X |

OTHER PUBLICATIONS

"Rejecting Rotational Disturbances on Small Disk Drives Using Rotational Accelerometers" Daniel Y. Abramovitch, 1996 IFAC World Congress in San Francisco, CA 1996, pp. 1–6.

"Increased Disturbance Rejection in Magnetic Disk Drives by Acceleration Feedforward Control and Parameter Adaption" M.T. White and M. Tomizuka, vol. 5, No. 6, 1997, pp. 741–751.

"Embedded Interconnect and Electrical Isolation for High–Aspect–Ratio, SOI Inertial Instruments" T. J. Brosnihan, J.F. Bustillo, A.P. Pisano and R.T. Howe, 1996 International Conference on Solid–State Sensors and Actuators, Chicago, Jun. 16–19, 1997, pp. 637–640.

* cited by examiner

Primary Examiner—William A. Powell
(74) Attorney, Agent, or Firm—Jimmy L. Funke (57) ABSTRACT

A micro-electro-mechanical structure including a semiconductor layer mounted to an annular support structure via an isolation layer wherein the semiconductor layer is micromachined to form a suspended body having a plurality of suspension projections extending from the body to the rim and groups of integral projections extending toward but spaced from the rim between said suspension projections. Each projection in said groups has a base attached to the body and a tip proximate the rim. The structure includes a plurality of inward projections extending from and supported on the rim and toward the body. Each such projection has a base attached to the rim and a tip proximate the body; wherein the grouped projections and the inward projections are arranged in an interdigitated fashion to define a plurality of proximate projection pairs independent of the suspension elements such that a primary capacitive gap is defined between the projections of each projection pair. Also, a process is disclosed for fabricating the micro-electro-mechanical structure including the steps of removing a highly doped etch termination layer and thereafter etching through a lightly doped epitaxial layer to thereby define and release the structure.

10 Claims, 4 Drawing Sheets

MEMS SENSOR STRUCTURE AND MICROFABRICATION PROCESS THEREFOR

CROSS REFERENCE TO RELATED APPLICATIONS

This application discloses subject matter which is disclosed and claimed in co-pending U.S. application Ser. No. 09/411,339, filed Oct. 1, 1999, in the names of John Carl Christenson et al., and entitled "Method and Apparatus for Electrically Testing and Characterizing Formation of Microelectronic Features," the entire contents of which are incorporated herein by reference. This application is also related to co-pending application Ser. No. 09/410,712, entitled "Angular Accelerometer," filed Oct. 1, 1999, in the name of David Boyd Rich.

TECHNICAL FIELD

The present invention relates to micro-electro-mechanical systems (MEMS) and in particular to an accelerometer and related microfabrication processes for the high-volume manufacture of such a device.

BACKGROUND OF THE INVENTION

Presently, micro-structure devices called MEMS (micro-electro-mechanical systems) are gaining popularity in the microelectronics industry. Such MEMS devices include, for example, micro-mechanical filters, pressure micro-sensors, micro-gyroscopes, micro-resonators, actuators, rate sensors, and acceleration sensors. These MEMS devices are created by microfabrication processes and techniques sometimes referred to as micromachining. These processes involve the formation of discrete shapes in a layer of semiconductor material by trenching into the layer with an etch medium. Because MEMS typically require movement of one or more of the formed shapes relative to others, the trenching is done in part over a cavity and in part over a substrate or bonding layer.

MEMS technology can be used to form rotary accelerometers. The main structure of a typical MEMS rotary accelerometer comprises a proof mass supported by a flexure suspension that is compliant for rotation but stiff for translation. In a known device, the suspension comprises fingers extending radially from the body straddled by inwardly projecting capacitor plates mechanically grounded to surrounding annular substrate area; see U.S. Pat. No. 5,251,484, "ROTATIONAL ACCELEROMETER" issued Oct. 12, 1993 to M. D. Mastache and assigned to Hewlett-Packard Co. of Palo Alto.

Forming the body mass and micro-mechanical parts of the MEMS device can generally be accomplished, for example, by a process of anisotropically etching through one or more upper layers of semiconductor material(s) which are situated above a cavity previously etched into a lower semiconductor substrate. Such a process for forming the body mass and micro-mechanical suspension parts of a MEMS device is often referred to as a "bond/etch-back" process. Other processes, however, can instead be utilized to form and/or release the body mass and micro-mechanical parts of a MEMS device. Such other processes can include a through-the-wafer etch process; a lateral release etch (confined or isotropic) process; or a lateral selective undercut etch of a buried layer, a film, or a buried etch-stop layer after a MEMS delineation etch has been performed.

In addition to properly forming the main structures of the MEMS accelerometer, electrically conductive lines are typically integrated with the structure to provide electrical communication between the structure and other microelectronic circuits. See FIG. 1 of the Mastache patent identified above. Furthermore, such a device is typically encapsulated and hermetically sealed within a microshell (i.e., a cap). The microshell serves many purposes, some of which include, for example, shielding the micro-mechanical parts of the MEMS device from particle (such as dust) contamination, shielding the micro-mechanical parts from corrosive environments, shielding the MEMS device from humidity (stiction) and $H_2O$ (in either the liquid or vapor phase), shielding the MEMS structure from mechanical damage (such as abrasion), and accommodating the need for the MEMS device to operate in a vacuum, at a particular pressure, or in a particular liquid or gas (such as, for example, dry nitrogen) environment.

A typical MEMS device has a size on the order of less than $10^{-3}$ meter, and may have feature sizes of $10^{-6}$ to $10^{-3}$ meter. This poses a challenge to the structural design and microfabrication processes associated with these small-scale, intricate and precise devices in view of the desire to have fabrication repeatability, fast throughput times, and high product yields from high-volume manufacturing. However, the achievement of these goals often primarily depends upon the ability to successfully execute the critical etching process step in accordance with a desired predetermined shape of the body mass and the micro-mechanical parts of a proposed MEMS device.

MEMS devices such as rotary accelerometers having opposing projections (fingers) which are interdigitated can present a challenge in the microfabrication processes particularly where dimensionally different but equally critical gap spacings must be etched at the same time. This is a result of the fact that wider gaps typically etch faster than narrower gaps.

There is a need in the art for an improved structural design for a MEMS device having interdigitated elements such as projections which will reduce or eliminate the adverse effects associated with the etch process. There is also a need in the art for an improved implementation of the etch process which can be utilized to specifically fabricate the above-mentioned improved structural design for a MEMS device having opposing, interposed and interspaced projections which will circumvent and thereby negate the adverse effects associated with the etch process.

SUMMARY OF THE INVENTION

The present invention provides a micro-electro-mechanical sensor structure with an improved design comprising rigid interdigitated projections forming capacitive plate elements and, in a preferred embodiment, flexible projections forming a rotationally compliant suspension. According to the invention, the micro-electro-mechanical structure basically comprises a semi-conductor layer which is micromachined to define a proof mass suspended relative to a support substrate by one or more flexible suspension projections extending from the proof mass to a substrate-based support area. Between these suspension projections and also extending outwardly from the proof mass are sets of additional rigid, spaced apart projections which move with the proof mass according to a compliance mode established by the suspension elements, e.g., at right angles to the longitudinal axes of the finger-like projections. Interdigitated with such projections are complemental projections extending from the support area toward the proof mass and defining, in combination with the rigid body projections, narrow sensor gaps of uniform width and larger, parasitic capacitive gaps. The sensor gaps are formed to exhibit essentially constant gap widths such that the etch process is easily geared to their formation with no loss of accuracy due to different etch rates in other areas of the film.

In the illustrative embodiment, the proof mass is generally circular and the suspension elements and interdigitated capacitance elements are radially arranged. The compliance mode in this embodiment is circular or rotary. However, linear devices using the principles hereafter explained are readily designed.

The present invention further provides an improved process for fabricating the micro-electro-mechanical structure with its improved design for opposing, interdigitated projections consistent with general bond/etch-back methods of fabrication. The process basically includes the steps of providing a first substrate, etching a cavity within the first substrate, and forming an isolation layer on the first substrate. Further steps include providing a second substrate, doping the top portion of the second substrate to thereby form an etch termination layer, forming al doped epitaxial layer on the etch termination layer portion of the second substrate such that the etch termination layer portion of the second substrate has a higher doping concentration than the epitaxial layer. Then, the second substrate is bonded to the first substrate such that the epitaxial layer covers the cavity and is bonded to the isolation layer at the periphery of the cavity of the first substrate. Then, the non-termination layer portion of the second substrate is removed from the etch termination layer portion of the second substrate, and the etch termination layer portion of the second substrate is removed from the epitaxial layer. A photoresist is then applied on the epitaxial layer, and the photoresist is patterned according to a predetermined shape of the micro-electro-mechanical structure. Thereafter, a step of anisotropically etching through sections of the epitaxial layer, as revealed by the patterned photoresist, is performed to thereby define and release the micro-electro-mechanical structure above the cavity,. The remaining patterned photoresist is then removed.

According to a preferred process of the present invention, the step of doping the top portion of the second substrate to thereby form an etch termination layer preferably includes the step of doping the top portion of the second substrate with a p-type dopant comprising boron and germanium. In addition, the step of forming a doped: epitaxial layer preferably includes the step of doping the layer with a p-type dopant. Furthermore, the first substrate and the second substrate preferably comprise silicon, and the isolation layer preferably comprises silicon dioxide.

Also according to the preferred process of the present invention, the step of applying photoresist on the epitaxial layer includes the step of utilizing a positive photoresist. In addition, the step of anisotropically etching through the epitaxial layer to, define and release the micro-electro-mechanical structure above the cavity preferably includes the step of contacting the epitaxial layer with a plasma comprising sulfur hexafluoride and oxygen, and the step of cooling the epitaxial layer to a cryogenic temperature of less than about 173 EK.

Further, according to the preferred process of the present invention, the step of pattering the photoresist according to a predetermined shape preferably includes the steps of determining a minimum capacitive gap between the interdigitated projections of the micro-electro-mechanical structure which are nearest to each other, defining the predetermined shape such that each base of each projection is proximate to at least one tip of another projection by a distance substantially equal to the minimum capacitive gap, and selectively removing the photoresist to reveal bare sections of the epitaxial layer according to the predetermined shape.

Other advantages, structural and process design considerations, and applications of the present invention will become apparent to those skilled in the art when the detailed description of the best mode contemplated for practicing the invention, as set forth hereinbelow, is read in conjunction with the accompanying drawings.

BRIEF DESCRIPTION OF THE DRAWINGS

The present invention will now be described, by way of example, with reference to the following drawings.

DESCRIPTION OF THE PREFERRED EMBODIMENT

Figure 1:
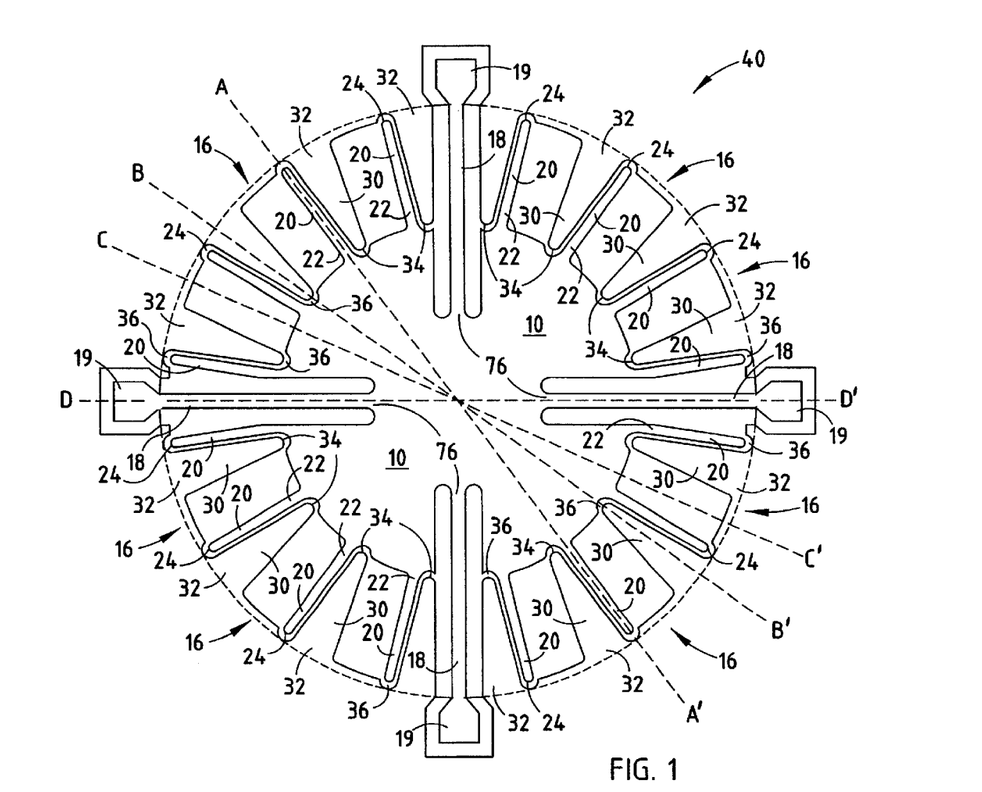
FIG. 1 is a top view of a sensing element for a rotational accelerometer MEMS device.
Figure 2A:
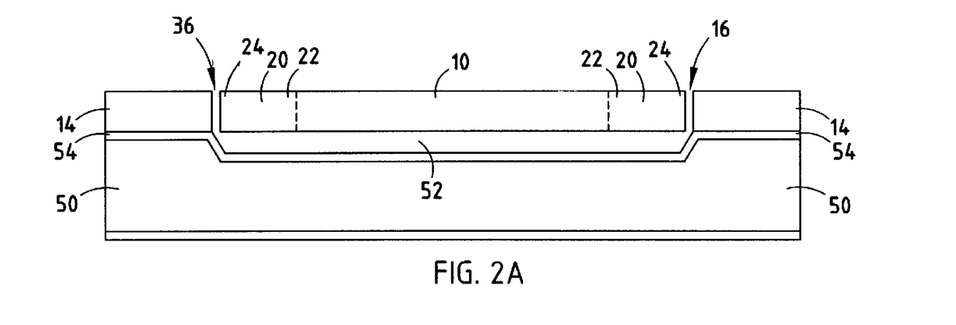
FIGS. 2(A) through 2(D) are cross-sectional views of the structure illustrated in FIG. 1 along section lines A–A', B–B', C–C' and D–D', respectively.
Figure 2B:
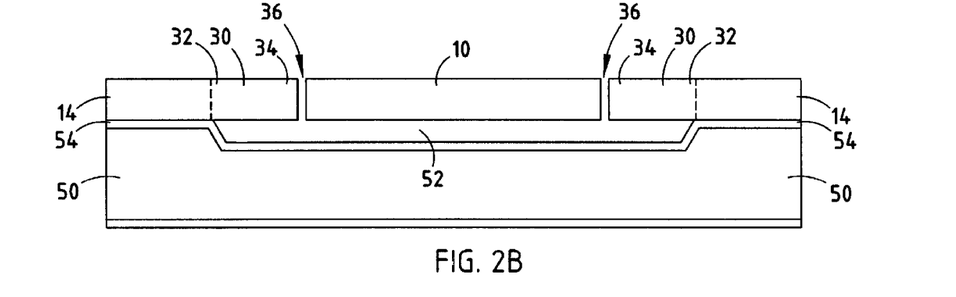
Figure 2C:
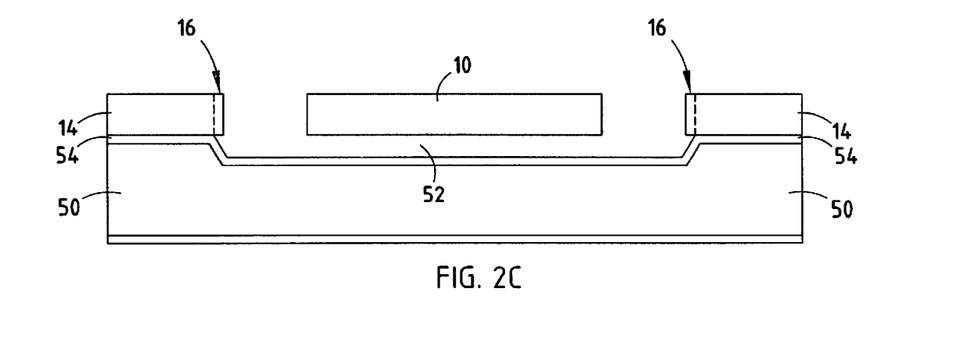
Figure 2D:
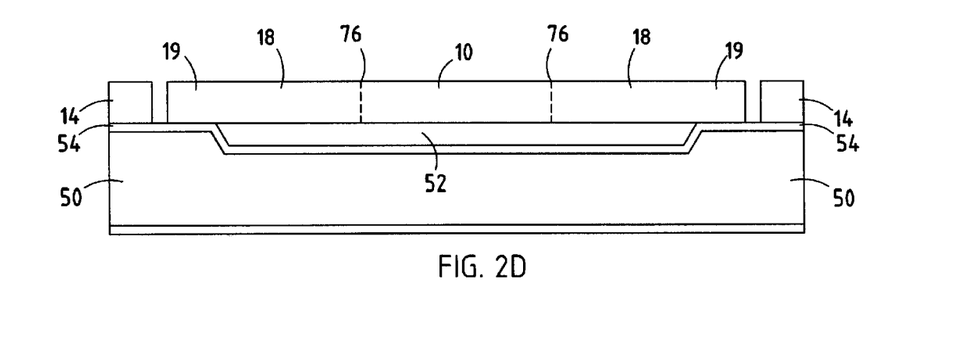

Referring to FIGS. 1 and 2, a rotary accelerometer sensor 40 comprises a generally circular, semiconductor mass 10 suspended relative to an annular support layer 54 by four equally spaced radially extending, flexible suspension projections 18. The projections extend into the body 10, are of relatively thin section, terminate in large-area tabs 19 and provide both rotary compliance and translational stiffness. Projections 18 form the suspension system for body 10 and do not, for all practical purposes, affect the capacitance as hereinafter explained.

Between each suspension projection 18, body 10 is formed to define a group of equally spaced and essentially constant width capacitive projections 20 which are integral with body 10 but extend radially outwardly therefrom. Projections 20 have rounded tips 24 which lengthen the sensor gap as hereinafter explained. The projections 20 effectively form one of two opposed capacitor plates as hereinafter explained. The suspension projections 18, for all practical purposes, do not form capacitor elements.

The FIG. 1 structure further comprises a four-piece rim structure collectively defining the second capacitor plate. The rim structure comprises four identical quadrants each including a rim element 16 having opposite end areas adjacent but spaced from a tab 19 and tapering, triangular, inwardly-projecting capacitive projections 30 having wide base areas 32 and rounded tips 34. Each projection 20 has one side lying adjacent and in closely and uniformly spaced relationship to a complemental side of a projection 30 to form a primary capacitive gap. Moreover, the rim structure is etched such that the capacitive gap continues around the tips 24 and 34 to define an S-shape. The other sides of the projections 20 and 30 are more widely spaced from each other; i.e., two or three times the spacing of the primary gap, to greatly reduce the capacitive coupling therebetween. The circular body 10 is widely spaced from rim 16 so as to reduce capacitive coupling in the radial direction except at the tips of the projections.

The result is a thin-film structure in which the four rim quadrants with their projections 30 can be electrically connected to form one plate of a capacitor while the body 10 with its projections 20 form the other plate. Complementary external electrical connections and components may be as disclosed in the Mastache patent the disclosure of which is incorporated herein by reference. When subjected to rotational acceleration about the center axis of the proof mass, the suspension projections or tethers 18 flex to permit angular movement of the proof mass and the outwardly extending fingers 20 relative to the rim structure of the inwardly extending fingers 30. This produces capacitive changes due to spacing variations in the primary gaps. The suspension elements 18 function essentially solely in a mechanical support, flexure suspension role and do not materially contribute to output signal quality.

The structure of FIGS. 1 and 2 incorporates two structural design advantages for a MEMS device having opposing interposed and interspaced projections which will circumvent the adverse effects associated with the etch lag phenomenon.

Concerning the first design advantage, the projections 20, according to the present invention, are relatively uniform in width along their lengths and have a high length to width ratio. The projections 30, on the other hand, are pyramidic in shape such that their sides are not parallel. As a result, however, one side of the first projection 20 and one side of the second projection 30 of each projection pair is substantially uniformly spaced apart from each other, along the length of the first projection 20, by a distance substantially equal to the minimum capacitive gap. Projections 20 and 30 can, of course, have various shapes, e.g., straight, angled and curved, so long as the sensor gaps between them are of uniform width. These projections 20 and 30, having such desirable dimensions and features, are prepared by the method of the invention which-avoids the over-etching associated with the etch lag phenomenon along wide trenches. As a result, the electrical characteristics (such as resistance and capacitance levels) inherent in the thicker and wider structure of each projection.(finger) are at desired levels and are no longer adversely affected due to excess thinning of each projection due to the over-etching associated with the etch lag phenomenon.

As a second design advantage, the tips 24 of the projections 20, according to the present invention, are proximate to the rim 16. In particular, the tips 24 are spaced from the rim 16 by a distance substantially equal to the capacitive gaps 36. The rim 16 !is preferably shaped such that the circumference of each tip 24 of each first projection 20 is substantially uniformly spaced from the rim 16 by a distance substantially equal to the primary capacitive gap. Such relatively close spacing between the tips 24 and the rim 16 is made possible by the method of the invention which avoids the over-etching associated with the etch lag phenomenon. The method of the invention avoids the tendency of prior art methods to excessively etch away tips 24.

Advantageously, the tips 34 of the projections 30, according to the present invention, are proximate to the body mass 10 to circumvent the effects associated with etch lag. In particular, the tips 34 are spaced from the body mass 10 by a distance substantially equal to the capacitive gaps 36. Such a close spacing between the tips,34 and the body mass 10 ensures that over-etching associated with the etch lag; phenomenon will neither excessively etch away the tips 34 nor excessively etch into the body mass 10. The body mass 10 is preferably shaped such that the circumference of each tip 34 of each second projection 30 is substantially uniformly spaced from the body mass 10 by a distance substantially equal to the primary capacitive gap.

Furthermore, concerning the second design advantage, the natural structural consequence of the closer spacings between the tips 24 and the rim 16 is that at least one side of each of the bases 32 associated with the projections 30 is proximately located near one of the tips 24 by a distance substantially equal to the capacitive gap 36. Such a closer spacing ensures that over-etching associated with the etch lag phenomenon will neither excessively etch into each of the bases 32 nor excessively etch away the tips 24.

Likewise, the natural structural consequence of the closer spacings between the tips 34 and the body mass 10 is that at least one side of each of the bases 22 associated with the projections 20 is proximately located near one of the tips 34 by a distance substantially equal to the capacitive gap 36. Such a closer spacing ensures that over-etching associated with the etch lag phenomenon will neither excessively etch into each of the bases 22 nor excessively etch away the tips 34.

Ultimately, as a result of the preferred structure in FIG. 1, the bases 22 of the projections 20 and the bases 32 of the projections 30 no longer have the tendency to be extraordinarily thin and fragile due to the etch lag phenomenon. Thus, the preferred structure according to the present invention helps eliminate the possibility that the projections 20 and the projections 30 may break off.

FIGS. 2(A) through 2(D) are cross-sectional views of the structure illustrated in FIG. 1 positioned over a cavity 52 in a substrate 50. An isolation layer 54 covers the substrate 50 as well as the lining of the cavity 52. The semiconductor leer 14 is mounted on the isolation layer 54 at the periphery of the cavity 52 such that the body mass 10 is suspended above the cavity 52 via cantilever suspension projections 18. Capacitive gaps 36 between the tips 24 of the first projections 20 and the rim 16, and capacitive gaps 36 between the tips 34 of the second projections and the body 10 are particularly highlighted in FIGS. 2(A) and 2(B). The cantilevers 18 are attached to the body mass 10 at points 76. The first projections 20 and the second projections 30 are defined in the semiconductor layer 14.

Figure 3:
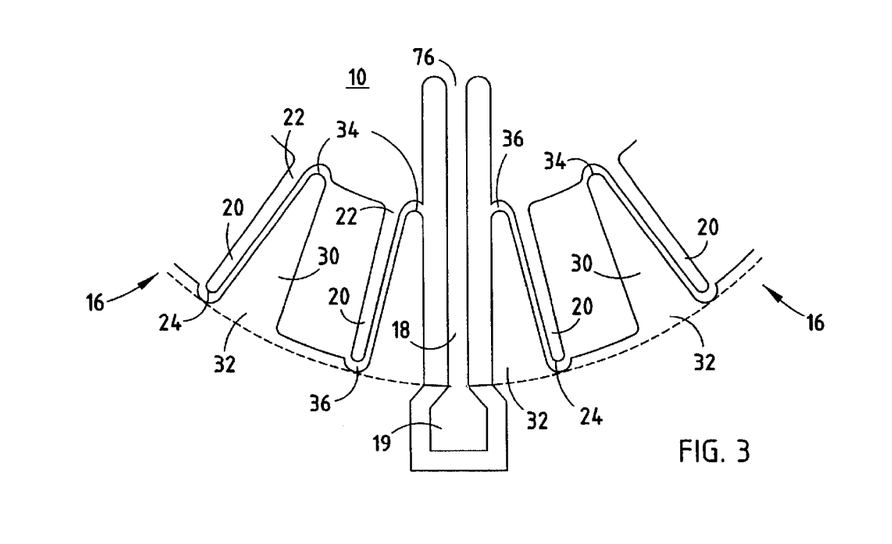
FIG. 3 is a partial top view of the structure illustrated in FIG. 1, particularly highlighting the cantilevers.

FIG. 3 is a partial top view of the structure illustrated in FIG. 1, particularly highlighting the cantilever 18. According to the preferred embodiment of the present invention, the sense structure 40 has at least one cantilever 18 connected between the body 10 and the rim 16. Each cantilever 18 thereby flexibly mounts the body 10 to the rim 16 such that the body 10 along with the rigid projections 20 are capable of rotational movement relative to the fixed surrounding structure including the projections 30 extending from the rim 16. The ideal gap surrounding the suspension projections 18 is greater than the minimum (sensor) gap between projections 20, 30 and equal to or smaller than the parasitic gap. Each cantilever 18, the semiconductor layer 14, the body 10, the first projections 20, and the second projections 30 are comprised of an electrically conductive, doped semiconductor material such that the differential capacitance between the first projections 20 and the second projections 30 can be electrically measured whenever the MEMS sense structure 40 experiences rotational acceleration caused by an external stimulus.

It is to be understood that the particular sense structure 40 for use in a capacitive rotational accelerometer, as illustrated in the figures, is only one of many different possible MEMS structures that can incorporate and benefit from the teachings of the present invention. In general, the novel aspects of the present invention can be utilized and incorporated in other MEMS structures having interdigitated projections as well.

The structure of a MEMS device may generally be fabricated by a bond/etch back technique. According to a past implementation of this technique, a first semiconductor substrate is formed and a cavity is thereafter etched into this first substrate. Next, an oxidation step is carried out to thereby form an oxide layer (that is, an isolation layer) over the surface and cavity of the first substrate. In addition to this first substrate, a second semiconductor substrate is formed separately from the first substrate. The top portion of this second substrate is typically very highly doped (that is, is highly concentrated) with p-type impurities, such as boron and/or germanium, to thereby create an etch termination layer (also sometimes referred to as an etch stop layer or a barrier layer). From a semiconductor fabrication and processing standpoint, attempted etching with an ICP DRIE (inductively coupled plasma deep reactive ion etch) machine through such a termination layer comprised of highly p-doped silicon, for example, is greatly attenuated. Next, a lightly doped epitaxial semiconductor layer (sometimes referred to as an "epi-layer") is grown on top of the second substrate. This epitaxial layer is to be the layer from which the structure of the MEMS device is ultimately defined and released.

Further regarding the past implementation of the bond/ etch back technique, once the epitaxial layer is properly formed on the second substrate, the second substrate along with its epitaxial layer is then inverted and bonded over the cavity in the first substrate such that the epitaxial layer covers the cavity and is bonded to the oxide layer (that is, isolation layer) at the periphery of the cavity. In this inverted configuration, the epitaxial layer is thus situated directly above the cavity, and the highly p-doped portion (that is, the etch termination layer portion) of the second substrate is on top of the epitaxial layer. After bonding and etch back is completed, an etch process step is then typically attempted to precisely etch deep trenches through both the highly p-doped portion (the etch termination layer portion) of the second substrate and the epitaxial layer until the cavity underneath these layers is breached. In this way, the remaining portions of the etch termination layer portion of the second substrate and the remaining portions of the :epitaxial layer are together released and suspended above the cavity. These remaining unetched portions will then serve as the micro-machined structure of a MEMS device.

A significant problem with the particular bond/etch back technique described above is that attempting to etch through both the highly p-doped portion (that is, the etch termination layer) of the second substrate and the lightly doped epitaxial layer simultaneously, during the same etching process step, often produces very poor and uneven sidewall profiles in the trenches being etched through these two layers. This is especially the case for the sidewalls of the trenches etched into the epitaxial layer. In particular, once the highly p-doped portion of the second substrate is etched through, the sidewall profiles of the trenches etched into the epitaxial layer are typically not anisotropic in form. That is, the sidewalls of the trenches are not substantially vertical and smooth, but are instead heavily striated or somewhat isotropic in form with undesired lateral etching into the. sidewalls of the trenches. Additionally, the silicon (for example) of the epitaxial layer may be undesirably micro-masked as a result of the etch termination layer being incompletely etched, thereby undesirably causing silicon "spires" or "grass" to be formed on the sidewalls and bottoms within the epitaxial layer trenches. Such uneven etching through the epitaxial layer is most likely attributable to the disparity in the etch rates inherent in the highly p-doped portion (that is, the etch termination layer portion) of the second substrate and the lightly doped epitaxial layer. Of most concern, however, is that such lateral etching into the sidewalls of: the trenches formed in the epitaxial layer ultimately produces a MEMS device structure which is malformed and rendered unfit for customer use. For instance, any silicon "spires" or "grass" undesirably formed within the trenches of the epitaxial layer often become particulates when the cavity underneath the epitaxial layer is breached during etching. These particulates can prevent or interfere with rotational translation of the suspended body, thereby directly hindering or preventing proper operation of the MEMS structure. Furthermore, these particulates can also undesirably physically bridge the gaps between the "capacitor plates" of the first projections and the second projections, thereby electrically shorting the first projections and the second projections together and rendering the MEMS structure useless. Thus, as a result, utilization of the particular technique described above can produce a relatively low product yield. The method according to the present invention significantly improves upon past implementations of the bond/etch back technique and produces anisotropic etching (that is, vertical and smooth trench sidewalls) through the epitaxial layer from which a MEMS structure is to be formed. FIGS. 4(A) through 4(M) illustrate the primary steps and stages of the preferred method/process for fabrication of the preferred MEMS structure according to the present invention.

Figure 4A:
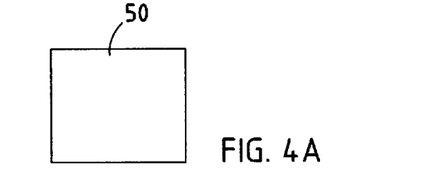
FIGS. 4(A) through 4(M) illustrate the primary steps and stages of the preferred process for fabrication of a MEMS structure having opposing, interposed and interspaced projections according to the present invention.

As illustrated in FIG. 4(A), a first substrate 50 made from semiconductor material(s) is initially formed and provided. According to the preferred embodiment of the present invention, the first substrate 50 is made primarily of silicon. However, the first substrate 50 can instead be comprised with other materials as well, such as, for example, glass, ceramic, sapphire, and stainless steel. Furthermore, the first substrate 50 can be doped (or not doped at all) with either n-type or p-type impurities at any doping concentration level. This first substrate can be formed by any acceptable method known in the art.

Figure 4B:
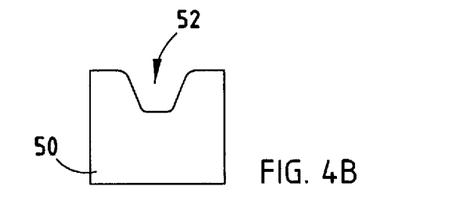

As illustrated in FIG. 4(B), a cavity 52 is then etched into the first substrate 50. The cavity 52 can be formed by any known conventional means, such as by a wet (chemical) etching technique or by a dry etching technique.

Figure 4C:
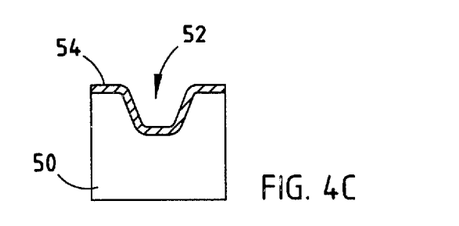

As illustrated in FIG. 4(C), an isolation layer 54, preferably comprised of silicon dioxide (commonly referred to as an "oxide layer"), is formed on the top surface of the first substrate 50 and the cavity 52. Any conventional means known in the art can be used to grow the isolation layer 54. One approach is to heat the first substrate 50 to a high temperature, for example, 850 to 1200 EC, in a controlled atmosphere containing either pure oxygen or water vapor. At such high temperatures, the oxygen and/or water vapor diffuse into and react with the silicon of the first substrate 50, thereby forming the silicon dioxide layer 54 on the exposed top surface of the first substrate 50. This silicon dioxide layer 54 serves as a bonding oxide, as a high-quality electrical insulator, and also as an etch termination layer.

Figure 4D:
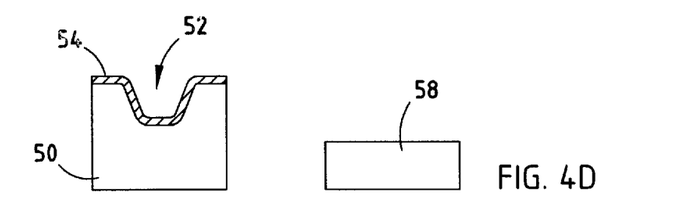

As illustrated in FIG. 4(D), a second substrate 58 is formed and provided from semiconductor material(s), separately from the first substrate 50. According to the preferred embodiment of the present invention, this second substrate 58 is made primarily of silicon. This second substrate 58 can be formed by any acceptable method known in the art.

Figure 4E:
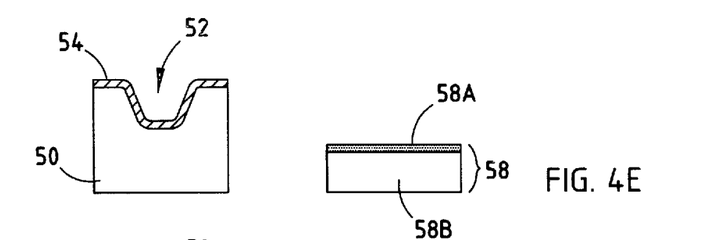

As illustrated in FIG. 4(E), the top portion 58A of the second substrate 58 is then doped with a high concentration of either n-type or p-type impurities to thereby transform the top portion 58A of the second substrate 58 into an etch termination layer. The lower portion 58B (that is, the non-termination layer portion) of the second substrate 58 is preferably left undoped. However, it is to be understood that the lower portion 58B may alternatively be doped. In such a case, the lower portion 58B must have a lower doping concentration than the top portion 58A to ensure that the top portion 58A can function as an etch termination layer. According to the preferred embodiment of the present invention, the top portion 58A of the second substrate 58 is preferably doped with p-type impurities, including boron and germanium. These two p-type impurities can be introduced into the top portion 58A of the second substrate 58 via a diffusion technique, via ion implantation, or, preferably, via in-situ doping during epitaxial silicon growth.

Figure 4F:
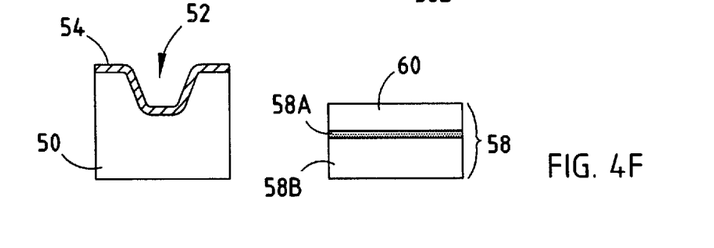

As illustrated in FIG. 4(F), a single-crystal epitaxial layer 60, preferably comprising silicon and lightly doped with a low concentration of either an n-type impurity or a p-type impurity, is grown on the etch termination layer portion 58A of the second substrate 58. Preferably, however, this epitaxial layer 60 is lightly doped with a p-type impurity. This epitaxial layer 60 is formed by conventional means, preferably by a chemical vapor deposition process used to deposit additional silicon on the etch termination layer portion 58A of the second substrate 58 and growing (that is, forming) a single-crystal silicon epitaxial layer 60 from the vapor phase (commonly referred to as "vapor-phase epitaxy") on the etch termination layer 58A. This single-crystal silicon epitaxial layer 60 can be doped with n-type impurities (such as phosphorus or arsenic) or, preferably, p-type impurities (such as, for example, boron or germanium) during the growth process by adding the impurities to the gas used during deposition of the additional silicon. The significance of having the epitaxial layer 60 lightly doped, with either an n-type impurity or a p-type impurity, as compared to the highly doped etch termination layer 58A, is discussed later hereinbelow.

Figure 4G:
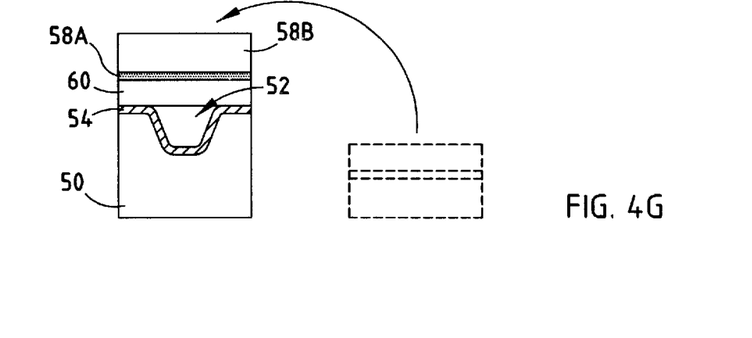

As illustrated in FIG. 4(G), once the epitaxial layer 60 is properly formed on the etch termination layer 58A of the second substrate 58, the second substrate 58 (with the etch termination layer 58A) along with the epitaxial layer 60 is then inverted and fusion bonded over the cavity 52 in the first substrate 50 such that the epitaxial layer 60 covers the cavity 50 and is bonded to the isolation layer 54 (preferably comprised of silicon dioxide) at the periphery of the cavity 52. In this inverted configuration, the epitaxial layer 60 is thus situated directly above the cavity 52, and the etch termination layer 58A is on top of the epitaxial layer 60.

Figure 4H:
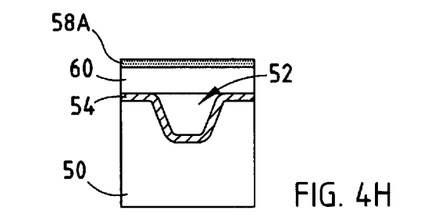
Figure 4I:
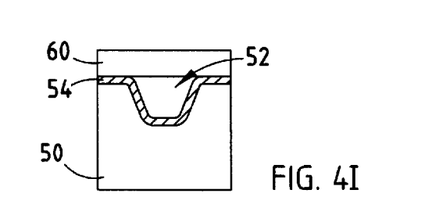

In light of the observed problems of undesired lateral etching into the trench sidewalls and of the undesired formation of silicon "grass" in the trenches when attempting to anisotropically etch through both a heavily p-doped etch termination layer and a lightly doped epitaxial layer during a single etch process step (as alluded to earlier hereinabove), the non-termination layer portion 58B of the second substrate and then the heavily p-doped etch termination layer 58A of the second substrate 58 are both first stripped away and entirely removed, as illustrated in FIGS. 4(H) and 4(I) according to the present invention, before etching through the epitaxial layer 60 is performed. This entire removal of the etch termination layer 58A before etching through the epitaxial layer 60 helps to thereafter facilitate clean, anisotropic etching through the epitaxial layer 60 so that the sidewalls of the trenches etched into the epitaxial layer 60 are substantially vertical without significant lateral etching into the sidewalls, without significant vertical sidewall striations, and without the formation of silicon "grass." Furthermore, the fact that the epitaxial layer 60 is lightly doped, as compared to the highly doped etch termination layer 58A, helps facilitate the clean and highly selective removal of the etch termination layer 58A from the epitaxial layer 60. As a result of such selective removal, the thickness of the remaining epitaxial layer 60 tends to be more uniform. Such uniformity in the thickness of the epitaxial layer 60 helps ensure that trenches which are etched into the epitaxial layer 60 will breach the cavity 52 underneath the epitaxial layer 60 within a more predictable period of time. Thus, uniformity in the thickness of the epitaxial layer 60 enables process engineers, for example, to monitor the anticipated time periods for etching entirely through the epitaxial layer 60 to thereby avoid problems of over-etching and/or under-etching the epitaxial layer 60.

Figure 4J:
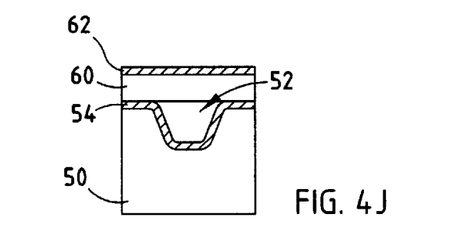

Once the etch termination layer 58A is removed from the epitaxial layer 60, a layer of light-sensitive photoresist 62 is applied over the epitaxial layer 60 as illustrated in FIG. 4(J). According to the preferred embodiment of the present invention, a positive type of photoresist should preferably be utilized instead of a negative type of photoresist. Positive photoresist facilitates better process control in this small-geometry structure. Application and formation of the photoresist layer 62 can typically be carried out by any known conventional means. This includes, for example, initially applying photoresist, in liquid form, over the epitaxial layer 60. After initial application, the bottom of the first substrate 50 is situated on a vacuum chuck and then spun at a high rate of speed to produce a thin layer of photoresist over the epitaxial layer 60. After being spun, the photoresist is then dried (sometimes referred to as "soft baking" or "pre-baking") to improve adhesion of the photoresist layer 62 to the epitaxial layer 60.

Figure 4K:
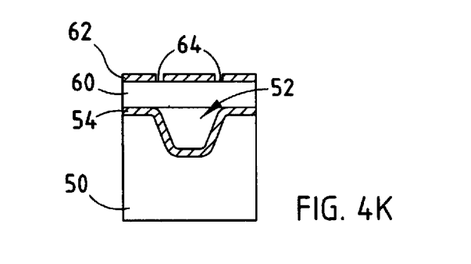

Once the layer of photoresist 62 is formed on the epitaxial layer 60, the photoresist layer 62 is thereafter patterned according to a desired, predetermined shape of the structure of a MEMS device being fabricated, as illustrated in FIG. 4(K). Patterning a layer of positive photoresist by conventional means typically involves the steps of, first, aligning a photomask over the photoresist layer. The photomask is pre-patterned according to the desired, predetermined shape of the MEMS structure to be fabricated. Next, some areas of the photoresist layer are selectively exposed to high-intensity ultraviolet light which is shown through the pre-patterned photomask onto the photoresist layer. Then, only the exposed areas of the photoresist layer are washed away, so that the sections of the epitaxial layer 60 which are still covered with remaining photoresist are protected from being etched away during subsequent etching of the epitaxial layer 60. On the other hand, bare sections 64 of the epitaxial layer 60 which are no longer covered by photoresist are then ready to be etched away.

Figure 4L:
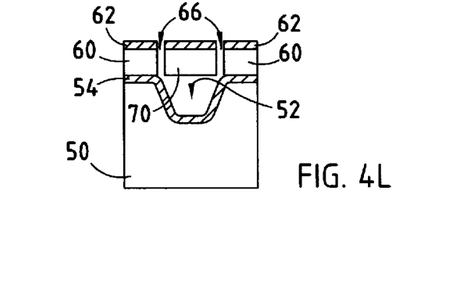

Once the photoresist layer 62. is patterned, trenches 66 are then anisotropically etched into the bare sections 64 of the epitaxial layer 60 until the cavity 52 underneath the epitaxial layer 60 is breached, as illustrated in FIG. 4(L). In this way, a micromachined MEMS structure 70 is defined in the epitaxial layer 60 substantially within a single plane and is released above the cavity 52. (Cantilevers which support and suspend the MEMS structure 70 above the cavity 52 are not shown in FIG. 4(L)). The isolation layer 54 (preferably comprised of silicon dioxide) which lines the floor of the cavity 52 serves as an etch termination layer to prevent etching into the first substrate 50 once the cavity 52 is breached. This same isolation layer 54 also serves to both physically and electrically isolate the first substrate 50 from the epitaxial layer 60. Thus, aside from perhaps structural support, the first substrate 50 plays no role in the electrical functionality of the MEMS structure. As a result, there is no real necessity for doping the first substrate 50, and process time, process complexity, and overall cost: is thereby reduced.

According to the present invention, any anisotropic etching technique may generally be utilized to etch the trenches 66 into the epitaxial layer 60. However, according to a preferred implementation of the present invention, the following high-precision, anisotropic etching technique may be utilized.

Particularly, the high-precision, anisotropic etching of the epitaxial layer 60 may be accomplished in an ALCATEL Comptech 602E deep silicon etch system at cryogenic temperatures (that is, temperatures less than approximately 173EK) using sulfur hexafluoride ($SF_6$) and oxygen ($O_2$) as the etch gases. ALCATEL Comptech is located in Fremont, Calif. and also has facilities in Annecy, Franceiand in Seoul, Korea. Preferred parameter settings for such a system which are necessary to execute such a high-precision, anisotropic etch are:

gas 1: $SF_6$, 250 sccm gas 2: $O_2$, 3 sccm power: 700 W press: 21.0 to 21.5 mTorr substrate bias: −44 to −35 V substrate coolant flow: He, 15 sccm plasma confinement current: 0.4 to 0.45 A electrode spacing: 6.5 to 6.8 inches temperature: 163 EK At such settings, the process time for etching may be varied as is appropriate for the desired etch depth and width for a given trench, as well as local and global plasma loading and diffusion effects. Ranges and variations in the above settings enable one to take into account minor adjustments in the plasma density and substrate bias to allow for the differences in the open area on the masks. The particular etch process parameters set forth above have produced aspect ratios of greater than 40:1 at 2 micrometer trench sizes. Furthermore, the above parameters have also produced an etch rate of 2.66 micrometers per minute in the minimum capacitive gaps of the MEMS structure illustrated in FIG. 1. The particular exemplary MEMS structure in FIG. 1 is a capacitive rotational accelerometer.

It is important to note the very low flow rate of the oxygen in this particular etch system. The low oxygen flow enhances performance of the etch system because,: generally, the higher the flow of oxygen, the faster the patterned photoresist mask layer 62 erodes during the etch. Since an oxygen plasma is used specifically for stripping photoresist, the low oxygen flow in the present etch system enables the deep trenches 66 to be etched into the bare sections 64 of the epitaxial layer 60 before the remaining patterned photoresist is eroded away. In this way, the deep trenches 66 can be etched into the epitaxial layer 60 by solely utilizing the patterned photoresist as an etch mask instead of also utilizing an inorganic hard mask. By solely utilizing the patterned photoresist as an etch mask, the additional process steps which typically accompany utilization of an inorganic hard mask are thereby eliminated, thus saving processing time and expense. Thus, there is a significant processing advantage to using standard photoresist as the only etch mask.

Furthermore, given that thermal expansion mismatch between the epitaxial layer 60 and the. photoresist limits the thickness of the photoresist that can be applied over the, epitaxial layer 60, and given that thicker photoresist layers craze at higher temperatures than thinner photoresist layers, it is important to use an etch process with high selectivity to the photoresist so that a thin layer of photoresist, which will not craze at room or cryogenic temperatures, may be used to mask the etch without eroding away before the deep trenches 66 breach the cavity 52 underneath the epitaxial layer 60. In light of such, room temperature etch processes (that is, pulsed halogen and carbon compound-forming gas processes) can be utilized as well. In this type of etch process, the epitaxial layer 60 is bathed with a halogen-containing plasma and a carbon compound-forming gas by any conventional means known in the art.

Some processes of the present invention are referred to as being conducted at room temperature. Room temperature suitable for these processes is in a range of 273 EK±25 EK.

The oxygen in this preferred etch system functions as a passivation gas on the sidewalls of the trenches 66. As etching proceeds, the oxygen reacts with the exposed silicon sidewalls to form silicon dioxide. Because of the highly directional physical component of the etch, and the etch selectivity of silicon to silicon dioxide of over 150:1 (on a horizontal surface—it is higher still on a vertical surface):, the resulting thin oxide layer on the sidewalls of the trenches to suffices as a passivation layer for the sidewall so that the etch through the epitaxial layer 610 remains anisotropic in nature. Because the oxygen flow is so low, the silicon etch rate is enhanced, leading to high aspect ratios of over 40: 1. Since the oxidation reaction of exposed silicon on the bottom of the deepening trench competes with the chemical and physical components of the silicon reaction with the etchant gas, a lower flow of oxygen favors the etch reaction, resulting in an enhanced etch rate.

Also, with this particular etch system, a properly micromachined MEMS structure that is released over the cavity 52 does not exhibit etch-related "stiction." Stiction is a condition where smooth surfaces tend to adhere. Thus, when a micromachined MEMS structure functions in part by requiring displacement of its projections relative to the first substrate 50 in response to some stimuli, or requires a standoff between portions of the projections and the first substrate 50, or must not be electrically shorted, for example, stiction will render such a micromachined MEMS structure useless. Thus, the fact that this preferred etch method is stiction-free is a significant processing benefit.

Figure 4M:
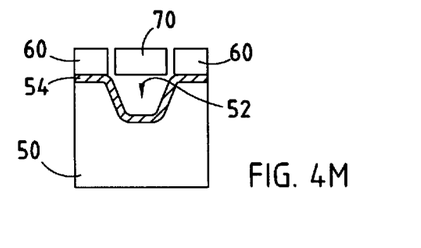

Finally, when etching is completed, remaining areas of the photoresist layer 62 are then removed from the epitaxial layer 60 and the MEMS structure 70, as illustrated in FIG. 4(M). This resulting MEMS structure 70 in FIG. 4(M), thus, represents the body 10 in FIG. 1 (without showing such detailed structures such as the cantilevers 18, the projections 20, and the projections 30). Photoresist removal can be accomplished by any known conventional means, such as, for example,i by utilizing conventional liquid resist strippers which cause the remaining photoresist to swell and lose adhesion to an underlying layer, in this case, the epitaxial layer 60. Dry processing (sometimes referred to as "resist ashing") or plasma ashing (a chemical reaction of O-radicals with carbon) is preferably used to remove the photoresist by oxidizing (that is, ashing) the photoresist in an oxygen plasma system.

In light of the above, it is important to note that the electrically active elements and/or features (such as the body 10, the projections 20, the projections 30, and the cantilevers 18 of FIG. 1) of the MEMS structure 70, fabricated according to the present invention, are substantially contained within a single plane corresponding to the single-crystal, epitaxial layer 60. The advantages of such are numerous, as set forth hereinbelow.

For example, potentially damaging abrasion of the electrically active elements and/or features is largely avoided. Also, subsequent encapsulation of the MEMS structure 70 within a "microshell" (that is, a cap) is better facilitated, for the microshell can have a thicker roof height (the portion of the microshell that stands out over the active features/elements must generally be recessed into the top cap to assure no physical hindrance of rotational translation of the active features/elements). That is, in general, the thicker the roof of the top cap, the less sensitive the MEMS structure 70 is to breakage during packaging (for example, overmolding).

Furthermore, utilizing a single-crystal epitaxial layer 60, as opposed to utilizing a thick polysilicon film, is advantageous in that the inherent stress in a polysilicon film, is much harder to control than in a single-crystal epitaxial layer. For example, undesired stress, which is somewhat common in thick polysilicon films, can cause elastic deformation of the surface of the active elements/features or, in the worst case, can cause delamination of the film, thereby leading to imprecise gap sizes after etching. In addition, utilizing a substantially single-plane, single-crystal epitaxial layer avoids many of the problems typically associated with thermal expansion (such as undesirable changes in gap sizes and undesirable changes in capacitances between features separated by such gaps), and enables the simultaneous etching and delineation of both the active features/elements (including the body 10, the projections 20, the projections 30, and the cantilevers 18 of FIG. 1) as well as any trenches which serve to electrically isolate active features/elements, metal lines/runners, and pads, as necessary, for proper electrical communication between the MEMS structure and any complementary circuitry or electronics. Furthermore, given that such simultaneous etching is performed late in the fabrication process according to the present invention, there is, as a result, desirably little time for debris to get into the trenches (formed in the epitaxial layer). In this way, debris is effectively prevented from hindering rotation of the MEMS structure, prevented from electrically shorting active features/elements of the MEMS structure, and prevented from:electrically shorting any nearby complementary circuitry or electronics.

In addition to the unique implementation of the bond/etch-back method set forth hereinabove, it is important to note that there are several other general methods of forming a MEMS structure like the one described hereinabove. These other methods include, but are not limited to, the SOI (silicon on insulator) method, the SOS (silicon on sapphire) method, the silicon with a buried sacrificial layer method, and others as are known by those skilled in the art. These other methods generally require a vertical etch followed by a lateral etch to release the active features/elements of the MEMS structure. The bond/etch-back method, as described hereinabove, however, requires no lateral etch to define and release the MEMS structure.

Such lateral release etches as are utilized in these other methods can include, but are not limited to, through-the-wafer etches; selective wet etches of an underlying layer (often an insulator, such as a buried oxide layer, which is common in SOI and SOS methods); a dry etch of an underlying layer (such as, for examples, a vapor phase hydrofluoric acid etch of a buried oxide, or a selective lateral etch of a buried layer in silicon, where the etchant species attacks a sub-surface layer selectively thereby freeing the MEMS structure from the substrate); and a set of methods where, after the vertical etch is complete, a non-selective lateral etch is performed at the bottom of the vertical etch thereby freeing the MEMS structure. These other methods and their lateral release etches typically have limited lateral etch rates. Thus, to effectively utilize these methods in a manufacturing process, the lateral distances to be etched must necessarily be small. Such generally dictates that any large areas that need to be released, such as body masses, must be perforated at regular intervals to allow the lateral etch to free the area (for example, body mass) in an acceptable amount of time. The bond/etch-back method, in contrast, does not require such perforations. As a result, utilizing the bond/etch-back method, as uniquely implemented hereinabove, is,the preferred method for fabricating MEMS structures, for it offers process advantages and saves cost. In particular, the lack of utilizing perforations in the bond/etch-back method allows for uni-body construction of the body mass, allows for a larger overall body mass, and thus allows for a larger rotational inertia for a same-sized body mass.

Although utilizing the bond/etch-back method as uniquely tailored hereinabove according to the present invention is preferred, such other general methods of fabricating a MEMS device can also be uniquely tailored to fabricate a MEMS structure with interdigitated projections. However, it is to be understood that the step of etching through sections of the epitaxial layer may require both vertical and lateral etching as dictated by the above-mentioned other general methods of fabricating a MEMS structure (that is, the methods other than the bond/etch-back method).

While the present invention has been described in what is presently considered to be the most practical and preferred embodiment and/or implementation, it is to be understood that the invention is not to be limited to the disclosed embodiment, but on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A process for fabricating a micro-electro-mechanical structure having interdigitated projections, said process comprising the steps of:

providing a first substrate;

etching a cavity within said first substrate;

forming an isolation layer on said first substrate;

providing a second substrate;

doping the top portion of said second substrate to thereby form an etch termination layer;

forming a doped epitaxial layer on the etch termination layer portion of said second substrate such that said etch termination layer portion of said second substrate has a higher doping concentration than said epitaxial layer;

bonding said second substrate to said first substrate such that said epitaxial layer covers said cavity and is bonded to said isolation layer at the periphery of said cavity;

removing the non-termination layer portion of said second substrate from said etch termination layer portion of said second substrate;

removing said etch termination layer portion of said second substrate from said epitaxial layer;

applying photoresist on said epitaxial layer;

patterning said photoresist according to a shape of said micro-electro-mechanical structure;

anisotropically etching through sections of said epitaxial layer disposed over said cavity and revealed through said patterned photoresist to thereby define and release said micro-electro-mechanical structure above said cavity; and removing said patterned photoresist.

2. The process according to claim 1, wherein said top portion of said second substrate is doped with a p-type dopant comprising boron and germanium.

3. The process according to claim 1, wherein said epitaxial layer is doped with a p-type dopant.

4. The process according to claim 1, wherein the photoresist is a positive photoresist.

5. The process according to claim 1, wherein the step of anisotropically etching through said epitaxial layer is accomplished by contacting said epitaxial layer with a plasma comprising sulfur hexafluoride and oxygen.

6. The process according to claim 5, wherein the step of anisotropically etching through said epitaxial layer includes cooling the epitaxial layer to a cryogenic temperature of less than about 173EK.

7. The process according to claim 1, wherein the step of anisotropically etching through said epitaxial layer is accomplished by a pulsed halogen and carbon compound-forming gas process.

8. The process according to claim 7, wherein the step of anisotropically etching through said epitaxial layer is performed at room temperature.

9. The process according to claim 1, wherein said first substrate and said second substrate comprise silicon, and wherein said isolation layer comprises silicon dioxide.

10. The process according to claim 1, wherein the step of patterning said photoresist according to a shape of said micro-electro-mechanical structure includes the steps of:

determining a minimum capacitive gap between said interdigitated projections of said micro-electro-mechanical structure which are nearest to each other, wherein each projection of said interdigitated projections has a base and a tip at opposite ends;

defining said shape such that each of said projection of said interdigitated projections is proximate to at least one tip of another said projection of said interdigitated projections by a distance substantially equal to said minimum capacitive gap; and selectively removing said photoresist to reveal bare sections of said epitaxial layer according to said shape.

* * * * *